United States Patent [19]
Park et al.

[11] Patent Number: 5,579,571
[45] Date of Patent: Dec. 3, 1996

[54] SURFACE MOUNT COMPONENT REMOVAL TOOL

[75] Inventors: Joon Park, Glendale; Russell T. Koga, Culver City, both of Calif.

[73] Assignee: Hughes Aircraft Company, Los Angeles, Calif.

[21] Appl. No.: 332,207

[22] Filed: Oct. 31, 1994

[51] Int. Cl.$^6$ ..................................................... H05K 13/00
[52] U.S. Cl. ................... 29/762; 29/256; 29/266; 29/426.4
[58] Field of Search .................. 29/762, 764, 426.4, 29/256, 258, 266

[56] References Cited

U.S. PATENT DOCUMENTS

| | | | |
|---|---|---|---|
| 4,583,287 | 4/1986 | McDevitt et al. | 29/764 X |
| 5,375,319 | 12/1994 | Jacobs | 29/764 X |

*Primary Examiner*—Carl E. Hall
*Attorney, Agent, or Firm*—Leonard A. Alkov; Wanda K. Denson-Low

[57] ABSTRACT

A removal tool for removing a bonded surface mount component from a printed wiring board. The removal tool comprises a printed wiring board holder for securing the printed wiring board. A base plate is provided and first and second end blocks are fastened to the base plate. The holder is slidable between the first and second end blocks. Two transverse guide shafts extend between the first and second end blocks. A main slide block is slidably attached to two transverse guide shafts, and is slidable along the shafts in response to rotation of the threaded rod. A torque application member is coupled to the surface mount component and to the main slide block for applying a downward force to the surface mount component during removal thereof. A threaded rod is rotatably disposed through the second end block and the torque application means that is rotatable to shear the bond between the surface mount component and the printed wiring board. A load cell may be disposed in the second end block for measuring the amount of force exerted by the removal tool on the surface mount component.

10 Claims, 3 Drawing Sheets

5,579,571

SURFACE MOUNT COMPONENT REMOVAL TOOL

BACKGROUND

The present invention relates generally to surface mount devices, and more particularly, to a removal tool for removing surface mount devices from printed wiring boards.

The prior an relating to the present invention may be described as a rotational shear removal tool. The rotational shear removal tool removes surface mount components bonded to printed wiring boards by rotating the surface mount component with respect to the printed wiring board until the bonding material breaks free. The primary disadvantage of the rotational shear removal tool is that the rotational shear is not consistent across the bonding area of the surface mount component. The rotational shear is at a minimum at the outer edges of surface mount component and a maximum at the center of the surface mount component. When comparing the present linear shear device and the conventional rotational shear device for a given component that is to be removed, there is typically more force applied to the surface mount component with the rotational shear device, which increases the possibility of damage to the component. Further, the rotational shear device can only remove relatively small components because larger components require an excessive amount of contact force on the surface mount component that would damage them.

In view of the above, it is an objective of the present invention to provide for an improved removal tool for removing surface mount devices from printed wiring boards. It is also an objective to provide for a removal tool that removes a bonded surface mount component from a printed wiring board using the application of linear shear to the body of the component. It is a further objective to provide for a removal tool that removes a bonded surface mount component from a printed wiring board that minimizes the possibility of damaging the body of the surface mount component and/or electrical leads during removal.

SUMMARY OF THE INVENTION

In order to provide for the above and other objectives, the present invention is a surface mount component removal tool that applies linear forces to a surface mount component to remove it from a printed wiring board. Bonding is required for surface mount components to provide for heat transfer, cooling paths, and structural stability. The removal tool removes bonded surface mount components by applying a linear shear force to the body of the surface mount component until the bond between the component and the printed wiring board is broken, and the component is separated from the printed wiring board.

The removal tool comprises a printed wiring board holder for securing the printed wiring board. A base plate has first and second end blocks fastened thereto. The holder is slidable between the first and second end blocks. Two transverse guide shafts extend between the first and second end blocks. A main slide block is slidably attached to two transverse guide shafts, and is slidable along the shafts in response to rotation of the threaded rod. Torque application means is coupled to the surface mount component for applying a downward force to the surface mount component during removal thereof. A threaded rod is rotatably disposed through the second end block and the torque application means that is rotatable to shear the bond between the surface mount component and the printed wiring board.

A load cell may be disposed in the second end block for measuring the amount of force exerted by the removal tool on the surface mount component. The main slide block comprises a threaded bushing for engaging the threaded rod 37, a thread mount block, an upper guide block coupled to a lower guide block by way of two vertical guide shafts. The torque application means comprises a shear block coupled to the surface mount component 14, a torque thumb screw rotatably fastened to the thread mount block and the upper guide block, and a driver disk coupled between the lower guide block 32 and the shear block. The torque thumb screw positively positions the driver disk and presses downward on the shear block during removal of the surface mount component, which provides a repeatable positive positioning force to minimize tilting of the shear block during removal of the surface mount component.

The printed wiring board is secured to the board holder and the shear block contacts the body of the surface mount component at areas that will not damage the body or electrical leads. The present removal tool provides for limited angular compliance. Positive pressure is placed on the surface mount component using the shear block. The torque limiting screw is used to apply positive pressure on the surface mount component by way of the shear block. Stress relief is provided between the shear block and the surface mount component.

The limited angular compliance feature of the present invention allows the shear block to comply as the surface mount component is removed from the printed wiring board. During removal, the bonding used to secure the surface mount component breaks at different locations, thereby changing the direction of the line of force required to continue breaking the bond. The present invention adjusts and continues to apply a distributed force along the body of the surface mount component during the entire removal process, thereby minimizing the possibility of applying a nondistributed (concentrated) force at a specific location, thereby damaging the surface mount component at that point.

Positive pressure applied to the surface mount component using the shear block ensures that a consistent position of the shear block driver and shear block is maintained. The present invention introduces a moment on the shear block that causes it to tilt during the removal process. Shear block tilt during the removal process could possibly disengage the tool from the surface mount component. This is minimized by using a repeatable downward force that serves to hold the shear block in a consistent orientation during the removal process.

The use of the torque limiting screw to provide for positive pressure on the surface mount component by way of the shear block controls the amount of positive downward force, thereby minimizing the possibility of operator-related error when positioning the driver disc. Too much force drives the surface mount component downward into the printed wiring board. Too little force potentially incorrectly positions the shear block and driver disc. The torque limiting screw has an optimized torque limit that provides for repeatable shear block positioning.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
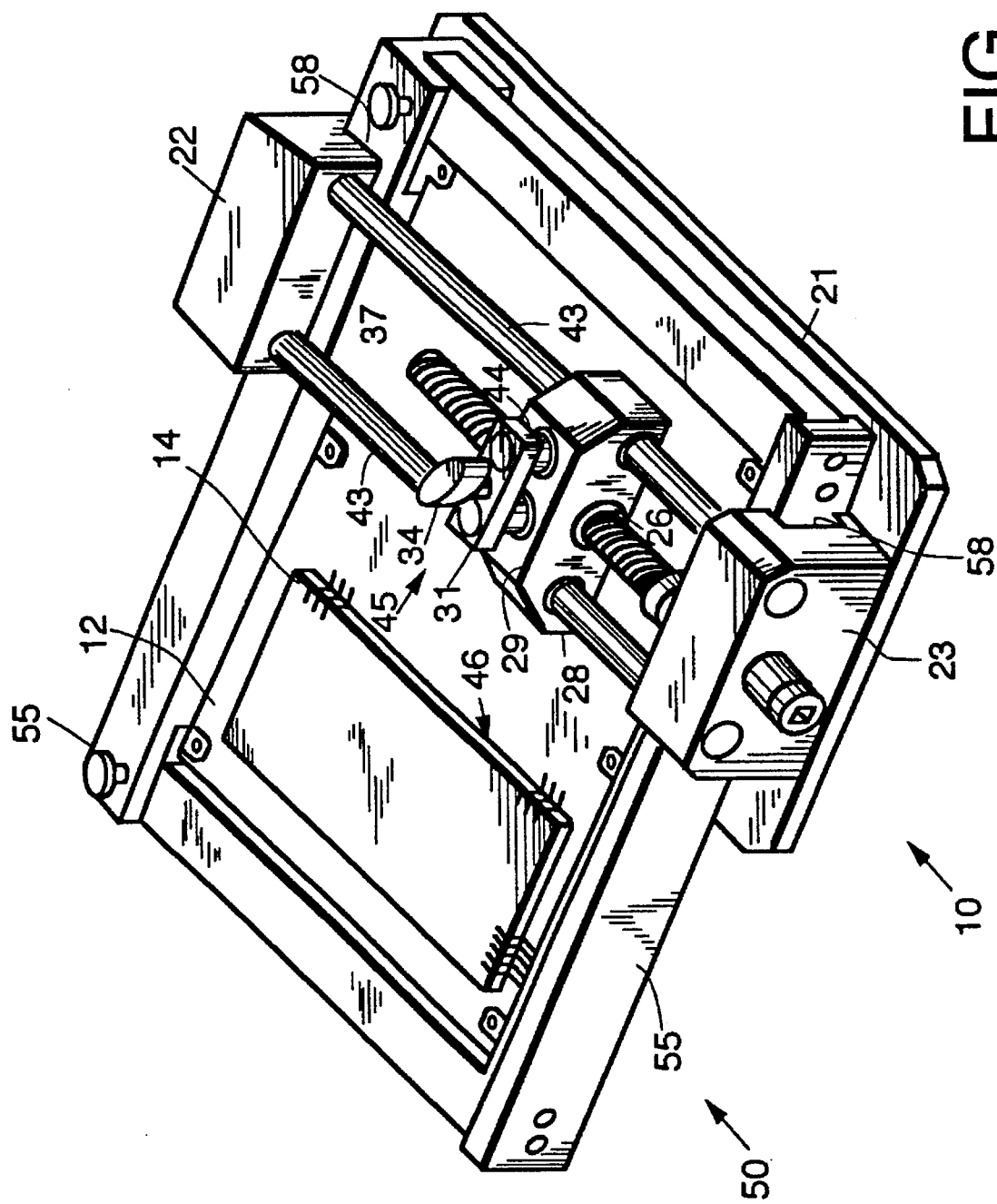
FIG. 1 is a perspective view of a removal tool in accordance with the principles of the present invention.
Figure 2:
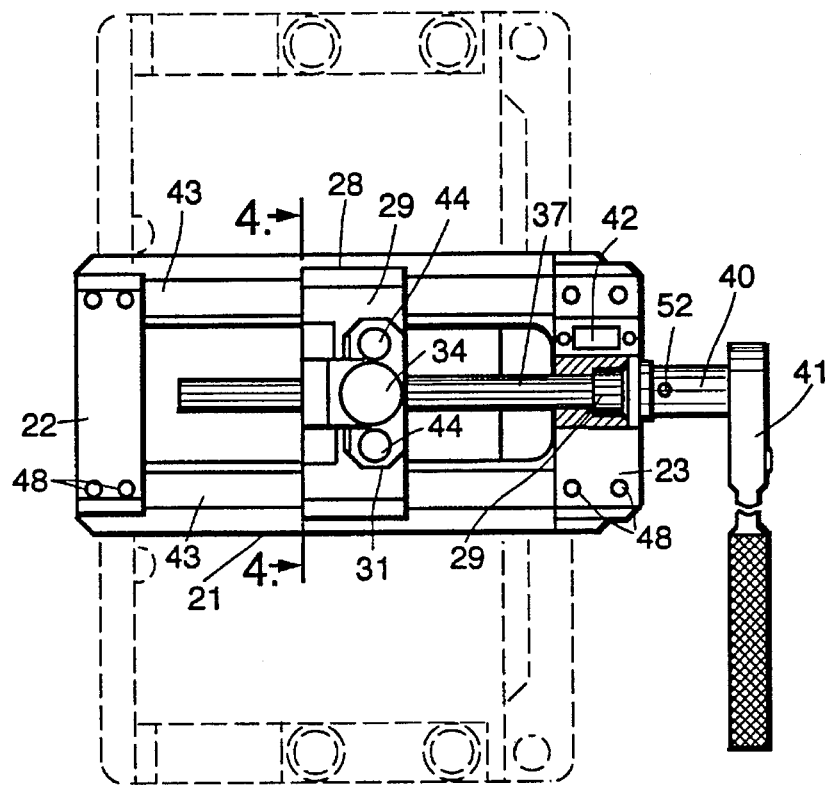
FIGS. 2–4 show top, side, and end views, respectively, of the removal tool of FIG. 1.
Figure 3:
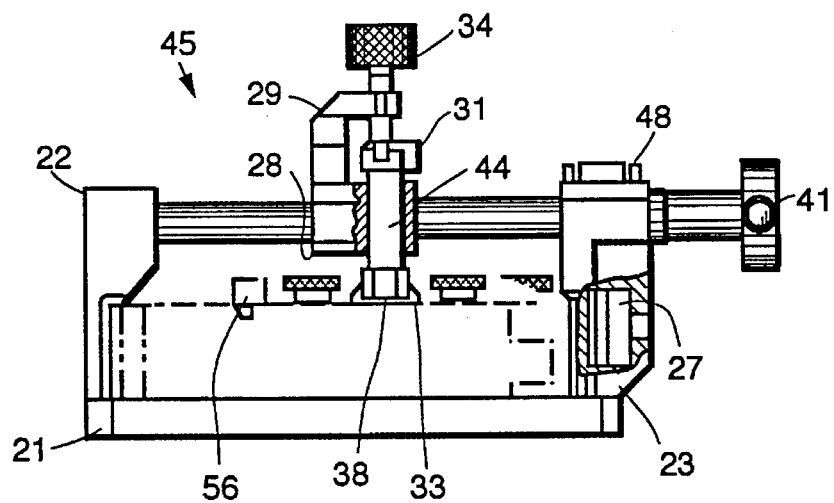
Figure 4:
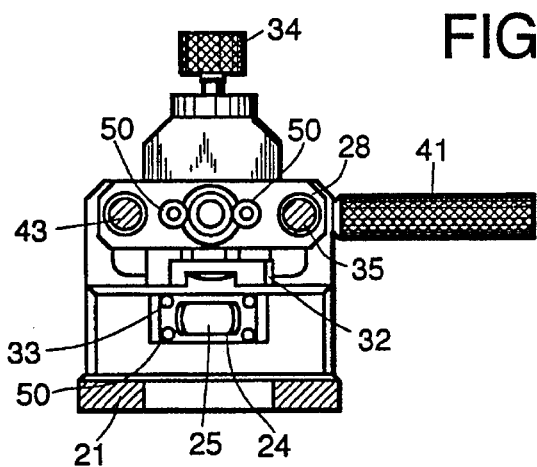
Figure 7:
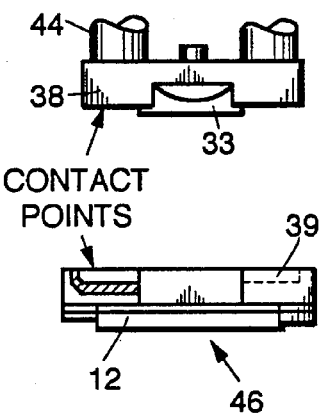
FIGS. 5–8 show various additional details of the removal tool of FIG. 1.

Referring to the drawing figures, FIG. 1 is a simplified perspective view of a removal tool 10 in accordance with the principles of the present invention, while FIGS. 2–4 show partially cutaway top and side views, and an end view taken in a direction indicated by the lines 4—4 in FIG. 2, respectively, of the removal tool 10. FIGS. 5–8 show various additional details of the removal tool 10.

The removal tool 10 is used to remove a surface mount component 14 from a printed wiring board 12 that was bonded 46 thereto. The printed wiring board 12 is mounted in a printed wiring board holder 50 that comprises two opposed slotted or grooved metal members 55 into which the printed wiring board 12 is slid and secured. The printed wiring board holder 50 provides a mounting frame for the printed wiring board 12.

The removal tool 10 is comprised of a base plate 21 having first and second end blocks 22, 23 fastened thereto. The first and second end blocks 22, 23 have slots 58 therein, and the board holder 50 that holds the printed wiring board 12, slides between the first and second end blocks 22, 23 in the slots 58. Two transverse guide shafts 43 extend between the first and second end blocks 22, 23 and serve to guide torque application means 45 comprising a main slide block 28 and components attached thereto across the printed wiring board 12. The main slide block 28 has two bushings 35 through which the transverse guide shafts 43 extend. The main slide block 28 has a threaded bushing 30, which engages a portion of an Amce threaded rod 37. Shear force is generated by rotating the Acme threaded rod 37 clockwise by means of a socket 40 attached to its end and secured thereto by means of a set screw 52 and a socket driver 41 (FIG. 2), which horizontally and transversely translates the main slide block 28 towards the first end block 22.

The first and second end blocks 22, 23 have a plurality of set screws 48 that secure the first and second shafts 43. The second end block 23 also houses a threaded bushing 26 for use with the Acme threaded rod 37. A load cell block 25 and a cover plate 24 secure a load cell 27 therebetween. The load cell 27 has an output connector 42 that is used to couple data to an output screen for viewing by an operator.

A thread mount block 29 is fastened to the main slide block 28 and secures a torque thumb screw 34. The torque thumb screw 34 is fastened to an upper guide block 31, which is connected to a lower guide block 32 by way of two guide shafts 44 such that when the torque thumb screw 34 is rotated, the upper guide block 31 and subsequently the lower guide block 32 translate in a vertical (downward) direction. Connected to the lower guide block 32 is a driver disk 33 that interfaces to a shear block 36. For each unique surface mount component 12 that is to be removed, there is a corresponding shear block 36 that interfaces with that particular component 12. The torque thumb screw 34 is used to positively position the driver disk 33 and to press downward on the shear block 36 during removal of the surface mount component 12. The torque thumb screw 34 provides a repeatable positive positioning force to minimize tilting of the shear block 36 during removal of the surface mount component 12.

Figure 5:
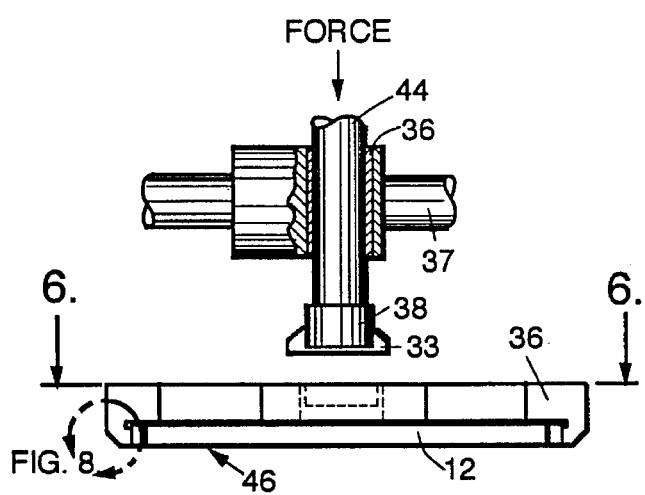
Figure 8:
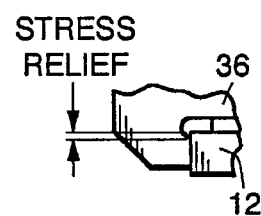
Figure 6:
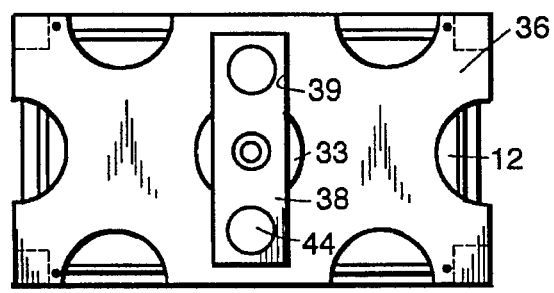

The printed wiring board is secured to the board holder 50 and the shear block 36 contacts the surface mount component 14 at areas that will not damage it or its electrical leads. The removal tool 10 provides for limited angular compliance. Positive pressure is applied to the surface mount component 14 using the shear block 36. The torque limiting screw 34 is used to apply positive pressure on the surface mount component 14 by way of the shear block 36. Stress relief is provided between the shear block 36 and the surface mount component 14 as shown in FIGS. 5 and 8.

The limited angular compliance feature of the present invention allows the shear block 36 to comply as the surface mount component 14 is removed from the printed wiring board 12. During removal, the bonding 46 used to secure the surface mount component 14 breaks at different locations, thereby changing the direction of the line of force required to continue breaking the bond 46. The present invention adjusts and continues applying a distributed force along the surface mount component 14 during the entire removal process, thereby minimizing the possibility of applying a nondistributed (concentrated) force at a specific location which would damage the surface mount component 14 at that point.

Positive pressure applied to the surface mount component 14 using the shear block 36 ensures that a consistent position of the shear block driver disc 33 and shear block 36 is maintained. The present invention introduces a moment on the shear block 36 that causes it to tilt during the removal process. Tilting of the shear block 36 during the removal process could possibly disengage the tool 10 from the surface mount component 14. This is minimized by applying a repeatable downward force that serves to hold the shear block 36 in a consistent orientation during the removal process.

The use of the torque limiting screw 34 to provide for positive pressure on the surface mount component 14 by way of the shear block 36 controls the amount of positive downward force, thereby minimizing the possibility of operator-related error when positioning the shear block driver disc 33. Too much force drives the surface mount component 14 downward into the printed wiring board 12. Too little force potentially incorrectly positions the shear block 36 and shear block driver disc 33. The torque limiting screw 34 has an optimized torque limit that provides for repeatable positioning of the shear block 36.

The basic requirements for the rework of bonded surface mount components 14 are generally the same for both commercial and military applications. This is especially true in cases where it is cost effective to rework an existing printed wiring board 12 by replacing bonded surface mount components 14 rather than replacing the entire board 12. The removal tool 10 permits rework of existing printed wiring boards 12 in a production environment or in the field. This allows removal of surface mount components 14 from printed wiring boards 12 without extensive damage and is a necessity for cost effective rework procedures.

In operation, and by way of example, a printed wiring board 12 is disposed in the grooved metal members 55 of the board holder 50 and has a surface mount component 14 bonded thereto that is to be removed. The board holder 50 is disposed between the first and second end blocks 22, 23. The shear block 36 is disposed on the surface mount component 12 and the board holder 50 and the main slide block 28 are positioned such that the driver disc 33 is concentric with the shear block 36 and the surface mount component 14. The torque thumb screw 34 is rotated clockwise to move the driver disc 33 downward until it engages the shear block 56, and is then rotated until the preset torque setting is reached and no further vertical translation is obtained. The Acme threaded rod 37 is then rotated clockwise using the socket 40 and the socket driver 41, which imparts a shear force on the surface mount component 14 as a result of the surface area of contact with the shear block 36. The clockwise rotation is continued until the shear force overcomes the strength of the bond 46 between the surface mount component 12 and the surface of the printed wiring board 14 and the surface mount component 12 is broken free.

The load cell 27 is used to ensure that the shear force generated by the removal tool 10 does not exceed a predetermined maximum value, which could damage the surface mount component 12. During the removal process, the operator visually monitors an output screen of the load cell 27 which indicates the amount of shear force that is generated so that shear force is not exerted beyond a preset maximum value..

Thus there has been described a new and improved removal tool for removing surface mount devices from printed wiring boards. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A removal tool for removing a bonded surface mount component from a printed wiring board, said removal tool comprising:

a printed wiring board holder for securing the printed wiring board;

a base plate;

first and second end blocks fastened to the base plate, and wherein the holder is slidable between the first and second end blocks;

two transverse guide shafts extending between the first and second end blocks;

a main slide block slidably attached to two transverse guide shafts, that is slidable along the shafts in response to rotation of a threaded rod; and torque application means coupled to the surface mount component and to the main slide block for applying a downward force to the surface mount component during removal thereof;

a threaded rod rotatably disposed through the second end block and the torque application means that is rotatable to shear the bond between the surface mount component and the printed wiring board.

2. The removal tool of claim 1 further comprising:

a load cell disposed in the second end block for measuring an amount of force exerted by the removal tool on the surface mount component.

3. The removal tool of claim 1 wherein the main slide block comprises:
a threaded bushing for engaging the threaded rod;
a thread mount block;
an upper guide block coupled to a lower guide block by way of two vertical guide shafts;

and wherein the torque application means coupled to the surface mount component for applying a downward force to the surface mount component during removal thereof, comprises:

a shear block coupled to the surface mount component;
a torque thumb screw rotatably fastened to the thread mount block and the upper guide block; and
a driver disk coupled between the lower guide block and the shear block;

and wherein the torque thumb screw positively positions the driver disk and presses downward on the shear block during removal of the surface mount component, which provides a repeatable positive positioning force to minimize tilting of the shear block during removal of the surface mount component.

4. The removal tool of claim I further comprising:

rotating means coupled to the threaded rod for rotating the rod to transversely move the main slide block and shear the bond between the surface mount component and the printed wiring board.

5. The removal tool of claim 1 wherein an area of stress relief is provided between the shear block and the surface mount component.

6. A removal tool for removing a bonded surface mount component from a printed wiring board, said removal tool comprising:

a printed wiring board holder for securing the printed wiring board;

a base plate;

first and second end blocks fastened to the base plate, and wherein the holder is slidable between the first and second end blocks;

a load cell disposed in the second end block for measuring an amount of force exerted by the removal tool on the surface mount component;

two transverse guide shafts extending between the first and second end blocks;

a main slide block slidably attached to two transverse guide shafts, that is slidable along the shafts in response to rotation of the threaded rod;

torque application means coupled to the surface mount component and to the main slide block for applying a downward force to the surface mount component during removal thereof;

a threaded rod rotatably disposed through the second end block and the torque application means; and rotating means coupled to the threaded rod for rotating the rod to transversely move the main slide block and shear the bond between the surface mount component and the printed wiring board.

7. The removal tool of claim 6 wherein the main slide block comprises:
a threaded bushing for engaging the threaded rod;
a thread mount block;
an upper guide block coupled to a lower guide block by way of two vertical guide shafts;

and wherein the torque application means coupled to the surface mount component for applying a downward force to the surface mount component during removal thereof, comprises:

a shear block coupled to the surface mount component;
a torque thumb screw rotatably fastened to the thread mount block and the upper guide block; and
a driver disk coupled between the lower guide block and the shear block;

and wherein the torque thumb screw positively positions the driver disk and presses downward on the shear block during removal of the surface mount component, which provides a repeatable positive positioning force to minimize tilting of the shear block during removal of the surface mount component.

8. The removal tool of claim 6 wherein an area of stress relief is provided between the shear block and the surface mount component.

9. A removal tool for removing a bonded surface mount component from a printed wiring board, said removal tool comprising:

a printed wiring board holder for securing the printed wiring board;

a base plate;

first and second end blocks fastened to the base plate, and wherein the holder is slidable between the first and second end blocks;

a load cell disposed in the second end block for measuring an amount of force exerted by the removal tool on the surface mount component;

two transverse guide shafts extending between the first and second end blocks;

a main slide block slidably attached to two transverse guide shafts, that is slidable along the shafts in response to rotation of the threaded rod, and wherein the main slide block comprises:

a threaded bushing for engaging the threaded rod;

a thread mount block;

an upper guide block coupled to a lower guide block by way of two vertical guide shafts;

torque application means coupled to the surface mount component and to the main slide block for applying a downward force to the surface mount component during removal thereof, and which comprises:

a shear block coupled to the surface mount component;

a torque thumb screw rotatably fastened to the thread mount block and the upper guide block; and a driver disk coupled between the lower guide block and the shear block;

and wherein the torque thumb screw positively positions the driver disk and presses downward on the shear block during removal of the surface mount component, which provides a repeatable positive positioning force to minimize tilting of the shear block during removal of the surface mount component;

a threaded rod rotatably disposed through the second end block and the torque application means; and rotating means coupled to the threaded rod for rotating the rod to transversely move the main slide block and shear the bond between the surface mount component and the printed wiring board.

10. The removal tool of claim 9 wherein an area of stress relief is provided between the shear block and the surface mount component.

* * * * *